United States Patent
Park et al.

(10) Patent No.: US 9,664,998 B2
(45) Date of Patent: May 30, 2017

(54) PHOTOMASK BLANKS, PHOTOMASKS FABRICATED USING THE SAME, AND METHODS OF FABRICATING PHOTOMASK USING THE SAME

(71) Applicant: SK hynix Inc., Icheon (KR)

(72) Inventors: Eui Sang Park, Yongin (KR); Kung Hoon Nam, Cheongju (KR)

(73) Assignee: SK HYNIX INC., Icheon (KR)

( * ) Notice: Subject to any disclaimer, the term of this patent is extended or adjusted under 35 U.S.C. 154(b) by 140 days.

(21) Appl. No.: 14/737,952

(22) Filed: Jun. 12, 2015

(65) Prior Publication Data

US 2016/0238926 A1     Aug. 18, 2016

(30) Foreign Application Priority Data

Feb. 17, 2015 (KR) .......................... 10-2015-0024490

(51) Int. Cl.
    *G03F 1/50*          (2012.01)
    *G03F 1/38*          (2012.01)

(52) U.S. Cl.
    CPC . *G03F 1/50* (2013.01); *G03F 1/38* (2013.01)

(58) Field of Classification Search
    CPC ..................................... G03F 1/38; G03F 1/50
    USPC ............................................................. 430/5
    See application file for complete search history.

(56) References Cited

U.S. PATENT DOCUMENTS 8,736,810 B2 *   5/2014   Wilklow ............... B82Y 10/00
                                                                     355/53

FOREIGN PATENT DOCUMENTS

| KR | 10-2001-0089483 A | 10/2001 |
| KR | 10-2011-0046545 A | 5/2011 |
| KR | 10-2001-0045283 A | 6/2011 |

* cited by examiner

*Primary Examiner* — Christopher Young

(57) ABSTRACT

Photomask blanks are provided. One of the photomask blanks includes a light transmission substrate, a light blocking layer disposed on a top surface of the light transmission substrate, and a heat radiation layer disposed on sidewalls and a bottom surface of the light transmission substrate. Related photomasks and fabrication methods of the photomasks are also provided.

20 Claims, 36 Drawing Sheets

PHOTOMASK BLANKS, PHOTOMASKS FABRICATED USING THE SAME, AND METHODS OF FABRICATING PHOTOMASK USING THE SAME

CROSS-REFERENCE TO RELATED APPLICATIONS

The present application claims priority under 35 U.S.C. 119(a) to Korean Application No. 10-2015-0024490, filed on Feb. 17, 2015, in the Korean intellectual property Office, which is incorporated herein by reference in its entirety as set forth in full.

BACKGROUND

1. Technical Field

Various embodiments of the present disclosure relate to photomasks used in lithography processes and, more particularly, to photomask blanks, photomasks fabricated using the same, and methods of fabricating photomasks using the same.

2. Related Art

In general, a semiconductor device may include a plurality of patterns disposed on a semiconductor substrate. The patterns may be formed using a photolithography process and an etch process to realize active elements and/or passive elements. The photolithography process may be used to form photoresist patterns. More specifically, the photolithography process may be performed by coating a photoresist material on a target layer to form a photoresist layer, by selectively exposing portions of the photoresist layer to light with a photomask, and by developing the exposed photoresist layer to form the photoresist patterns. The photoresist patterns may be used as etch masks for patterning the target layer. As such, the photomask may be used to transfer predetermined pattern images onto the photoresist layer and may be generally comprised of a transparent substrate and a plurality of transfer patterns.

In the photolithography process, light having a specific wavelength may irradiate a photoresist layer on a wafer through a photomask. In such a case, regions on which light blocking patterns are disposed on the photomask may prevent the light from irradiating the wafer, and only light transmitting regions of the photomask may allow the light to reach the wafer. During the photolithography process, the light blocking patterns may absorb a large amount of optical energy of the light irradiating the photomask, thereby generating heat. The heat may be conducted to the transparent substrate of the photomask, and the transparent substrate may be expanded and deformed due to the heat. The thermal deformation of the transparent substrate may cause a position change of overlay patterns of the photomask. As a result, the thermal deformation of the transparent substrate may lead to an overlay error between the photomask and the wafer.

SUMMARY

Various embodiments are directed to photomask blanks, photomasks fabricated using the same, and methods of fabricating photomasks using the same.

According to an embodiment, a photomask blank includes a light transmission substrate, a light blocking layer disposed on a top surface of the light transmission substrate, and a heat radiation layer disposed on sidewalls and a bottom surface of the light transmission substrate.

According to another embodiment, a photomask blank includes a light transmission substrate, a phase shift layer disposed on a top surface of the light transmission substrate, a light blocking layer disposed on the phase shift layer, and a heat radiation layer disposed on sidewalls and a bottom surface of the light transmission substrate.

According to another embodiment, a photomask blank includes a light transmission substrate, a light blocking layer disposed on a top surface of the light transmission substrate, and a high strength support layer disposed on sidewalls and a bottom surface of the light transmission substrate.

According to another embodiment, a photomask blank includes a light transmission substrate, a phase shift layer disposed on a top surface of the light transmission substrate, a light blocking layer disposed on the phase shift layer, and a high strength support layer disposed on sidewalls and a bottom surface of the light transmission substrate.

According to another embodiment, a photomask includes a light transmission substrate having a transfer region and a frame region that surrounds the transfer region, a first light blocking pattern disposed on a top surface of the light transmission substrate in the transfer region, a second light blocking pattern disposed on a top surface of the light transmission substrate in the frame region, and a heat radiation pattern disposed on sidewalls and a portion of a bottom surface of the light transmission substrate.

According to another embodiment, a photomask includes a light transmission substrate having a transfer region and a frame region that surrounds the transfer region, a first phase shift pattern disposed on a top surface of the light transmission substrate in the transfer region, a second phase shift pattern and a light blocking pattern sequentially stacked on a top surface of the light transmission substrate in the frame region, and a heat radiation pattern disposed on sidewalls and a portion of a bottom surface of the light transmission substrate.

According to another embodiment, a photomask includes a light transmission substrate having a transfer region and a frame region that surrounds the transfer region, a first light blocking pattern disposed on a top surface of the light transmission substrate in the transfer region, a second light blocking pattern disposed on a top surface of the light transmission substrate in the frame region, and a high strength support pattern disposed on sidewalls of the light transmission substrate.

According to another embodiment, a photomask includes a light transmission substrate having a transfer region and a frame region that surrounds the transfer region, a first phase shift pattern disposed on a top surface of the light transmission substrate in the transfer region, a second phase shift pattern and a light blocking pattern sequentially stacked on a top surface of the light transmission substrate in the frame region, and a high strength support pattern disposed on sidewalls of the light transmission substrate.

According to another embodiment, a method of fabricating a photomask includes providing a photomask blank. The photomask blank includes a light transmission substrate that has a transfer region and a frame region surrounding the transfer region, a light blocking layer disposed on a top surface of the light transmission substrate, and a heat radiation layer disposed on sidewalls and a bottom surface of the light transmission substrate. The light blocking layer is patterned to form a light blocking pattern that exposes a portion of the light transmission substrate in the transfer region. A mask pattern is formed to expose a portion of the heat radiation layer below the transfer region. The exposed portion of the heat radiation layer is removed to form a heat radiation pattern. The mask pattern is removed after the heat radiation pattern is formed.

According to another embodiment, a method of fabricating a photomask includes providing a photomask blank. The photomask blank includes a light transmission substrate that has a transfer region and a frame region surrounding the transfer region, a phase shift layer disposed on a top surface of the light transmission substrate, a light blocking layer disposed on the phase shift layer, and a heat radiation layer disposed on sidewalls and a bottom surface of the light transmission substrate. The light blocking layer and the phase shift layer are patterned to form light blocking patterns and phase shift patterns that expose a portion of the light transmission substrate in the transfer region. The light blocking patterns located above the transfer region are selectively removed. A mask pattern is formed to expose a portion of the heat radiation layer below the transfer region. The exposed portion of the heat radiation layer is removed to form a heat radiation pattern. The mask pattern is removed after the heat radiation pattern is formed.

According to another embodiment, a method of fabricating a photomask includes providing a photomask blank. The photomask blank includes a light transmission substrate that has a transfer region and a frame region surrounding the transfer region, a light blocking layer disposed on a top surface of the light transmission substrate, and a high strength support layer disposed on sidewalls and a bottom surface of the light transmission substrate. The light blocking layer is patterned to form a light blocking pattern that exposes a portion of the light transmission substrate above the transfer region. A mask pattern is formed to expose a portion of the high strength support layer below the transfer region. The exposed portion of the high strength support layer is removed to form a high strength support pattern. The mask pattern is removed after the high strength support pattern is formed.

According to another embodiment, a method of fabricating a photomask includes providing a photomask blank. The photomask blank includes a light transmission substrate that has a transfer region and a frame region surrounding the transfer region, a phase shift layer disposed on a top surface of the light transmission substrate, a light blocking layer disposed on the phase shift layer, and a high strength support layer disposed on sidewalls and a bottom surface of the light transmission substrate. The light blocking layer and the phase shift layer are patterned to form light blocking patterns and phase shift patterns that expose a portion of the light transmission substrate in the transfer region. The light blocking patterns located above the transfer region are selectively removed. A mask pattern is formed to expose a portion of the high strength support layer below the transfer region. The exposed portion of the high strength support layer is removed to form a high strength support pattern. The mask pattern is removed after the high strength support pattern is formed.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

It will be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present disclosure.

It will also be understood that when an element is referred to as being located "on", "over", "above", "under", "beneath" or "below" another element, it may directly contact the other element, or at least one intervening element may be present therebetween. Accordingly, the terms such as "on", "over", "above", "under", "beneath", "below" and the like that are used herein are for the purpose of describing particular embodiments only and are not intended to limit the scope of the present disclosure.

It will be further understood that when an element is referred to as being "connected" or "coupled" to another element, it can be directly connected or coupled to the other element or intervening elements may be present.

Figure 1:
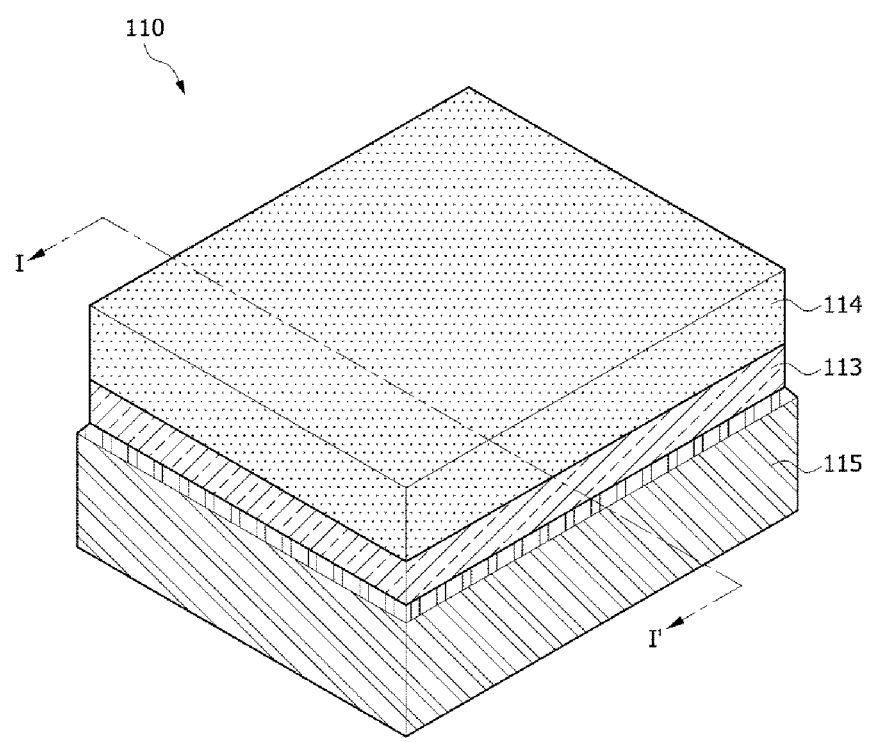
FIG. 1 is a perspective view illustrating a photomask blank according to an embodiment.
Figure 2:
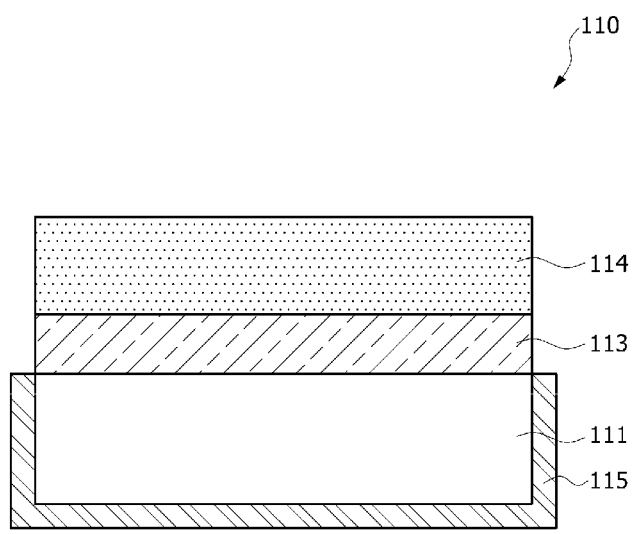
FIG. 2 is a cross-sectional view taken along a line I-I' of FIG. 1.

FIG. 1 is a perspective view illustrating a photomask blank 110 according to an embodiment, and FIG. 2 is a cross-sectional view taken along a line I-I' of FIG. 1.

Referring to FIGS. 1 and 2, the photomask blank 110 may be provided to fabricate a binary photomask. The photomask blank 110 may include a light transmission substrate 111, a light blocking layer 113 disposed on the light transmission substrate 111, and a resist layer 114 disposed on the light blocking layer 113. In some embodiments, the resist layer 114 may be absent. The light blocking layer 113 may cover an entire top surface of the light transmission substrate 111. The resist layer 114 may cover an entire top surface of the light blocking layer 113. In some embodiments, the light transmission substrate 111 may be a quartz substrate, and the light blocking layer 113 may be a chromium (Cr) layer.

A heat radiation layer 115 may be disposed on sidewalls and a bottom surface of the light transmission substrate 111. In some embodiments, the heat radiation layer 115 may cover the bottom surface and each sidewall of the light transmission substrate 111. The heat radiation layer 115 may include a material having a heat conductivity that is higher than a heat conductivity of the light transmission substrate 111. In some embodiments, when the light transmission substrate 111 is a quartz substrate, the heat radiation layer 115 may include a metal material such as an aluminum (Al) material, a copper (Cu) material, a gold (Au) material or a silver (Ag) material.

Figure 3:
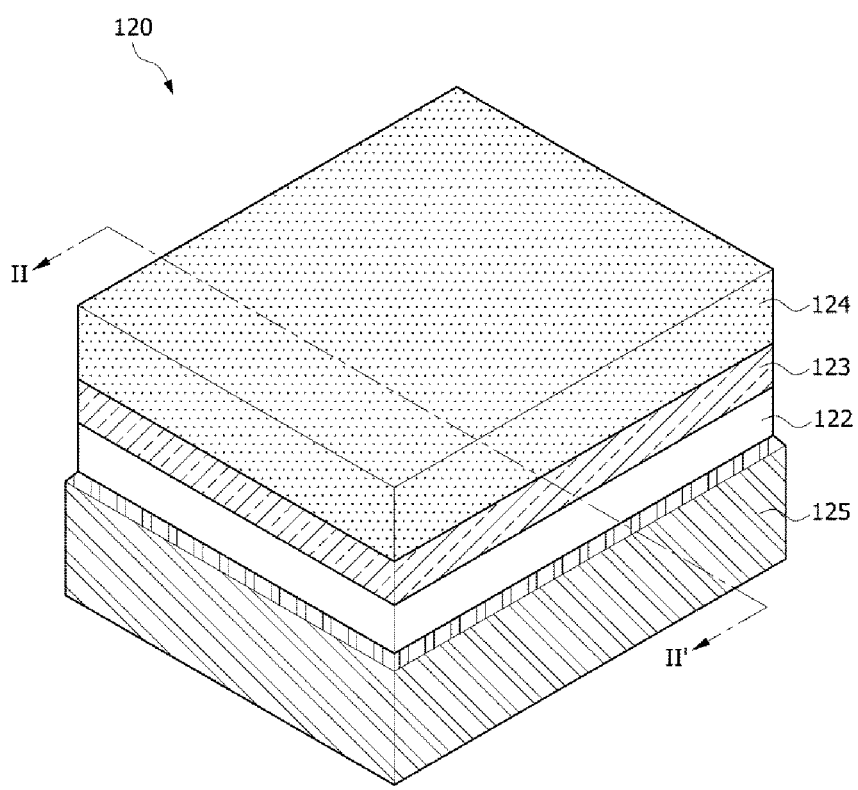
FIG. 3 is a perspective view illustrating a photomask blank according to another embodiment.
Figure 4:
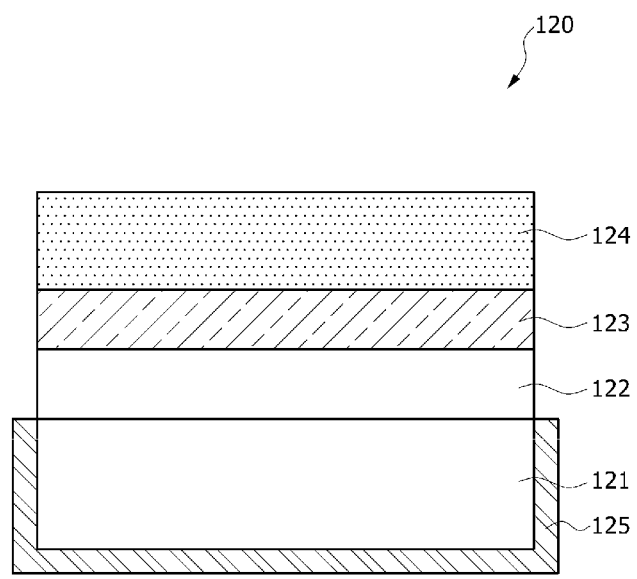
FIG. 4 is a cross-sectional view taken along a line II-II' of FIG. 3.

FIG. 3 is a perspective view illustrating a photomask blank 120 according to another embodiment, and FIG. 4 is a cross-sectional view taken along a line II-II' of FIG. 3. Referring to FIGS. 3 and 4, the photomask blank 120 may be provided to fabricate a phase shift mask (PSM). The photomask blank 120 may include a light transmission substrate 121, a phase shift layer 122 disposed on the light transmission substrate 121, a light blocking layer 123 disposed on the phase shift layer 122, and a resist layer 124 disposed on the light blocking layer 123. In some embodiments, the resist layer 124 may be absent. The phase shift layer 122 may cover an entire top surface of the light transmission substrate 121. The light blocking layer 123 may cover an entire top surface of the phase shift layer 122. The resist layer 124 may cover an entire top surface of the light blocking layer 123. In some embodiments, the light transmission substrate 121 may be a quartz substrate, and the phase shift layer 122 may be a molybdenum silicon (MoSi) layer. The light blocking layer 123 may be a chromium (Cr) layer.

A heat radiation layer 125 may be disposed on sidewalls and a bottom surface of the light transmission substrate 121. In some embodiments, the heat radiation layer 125 may cover the bottom surface and each sidewall of the light transmission substrate 121. The heat radiation layer 125 may include a material having a heat conductivity that is higher than a heat conductivity of the light transmission substrate 121. In some embodiments, when the light transmission substrate 121 is a quartz substrate, the heat radiation layer 125 may include a metal material such as an aluminum (Al) material, a copper (Cu) material, a gold (Au) material or a silver (Ag) material.

Figure 5:
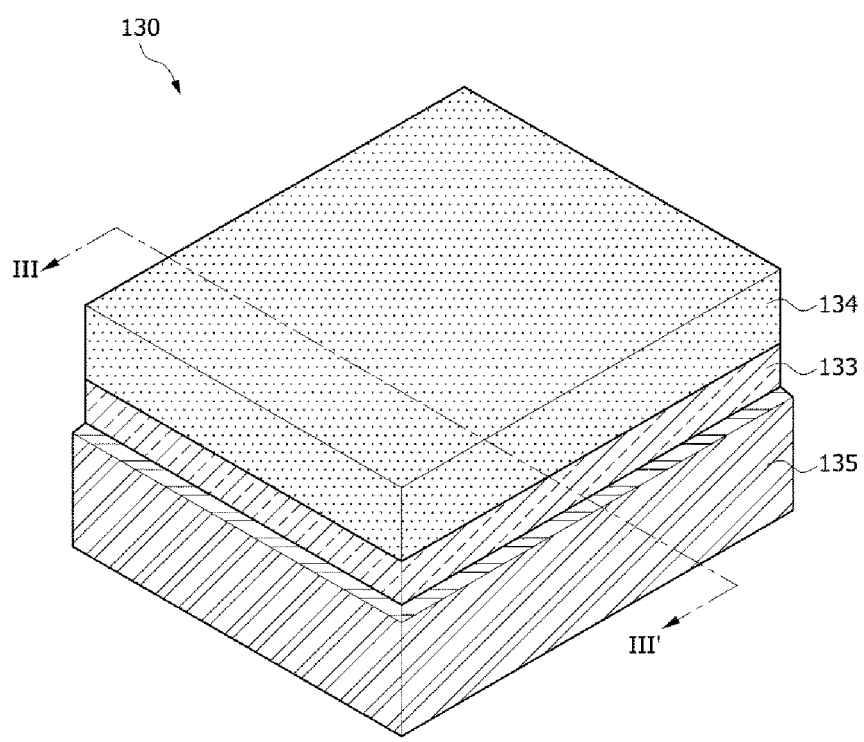
FIG. 5 is a perspective view illustrating a photomask blank according to yet another embodiment.
Figure 6:
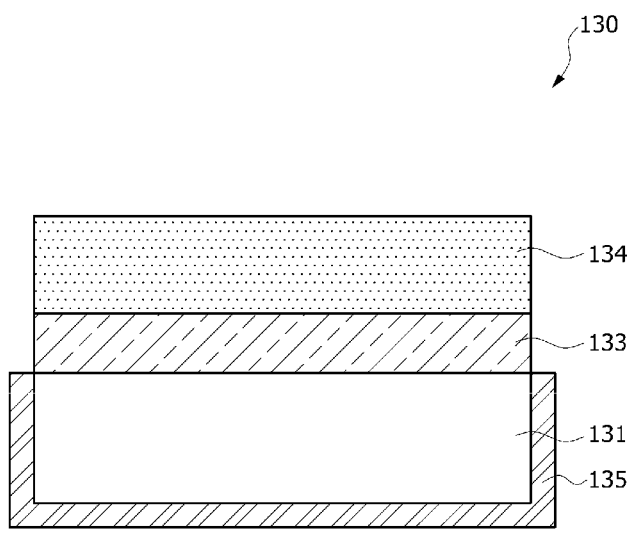
FIG. 6 is a cross-sectional view taken along a line III-III' of FIG. 5.

FIG. 5 is a perspective view illustrating a photomask blank 130 according to yet another embodiment, FIG. 6 is a cross-sectional view taken along a line III-III' of FIG. 5. Referring to FIGS. 5 and 6, the photomask blank 130 may be provided to fabricate a binary photomask. The photomask blank 130 may include a light transmission substrate 131, a light blocking layer 133 disposed on the light transmission substrate 131, and a resist layer 134 disposed on the light blocking layer 133. In some embodiments, the resist layer 134 may be absent. The light blocking layer 133 may cover an entire top surface of the light transmission substrate 131. The resist layer 134 may cover an entire top surface of the light blocking layer 133. In some embodiments, the light transmission substrate 131 may be a quartz substrate, and the light blocking layer 133 may be a chromium (Cr) layer.

A high strength support layer 135 may be disposed on sidewalls and a bottom surface of the light transmission substrate 131. In some embodiments, the high strength support layer 135 may cover the bottom surface and each sidewall of the light transmission substrate 131. The high strength support layer 135 may include a material having a coefficient of thermal expansion that is lower than a coefficient of thermal expansion of the light transmission substrate 131. In some embodiments, when the light transmission substrate 131 is a quartz substrate, the high strength support layer 135 may include a reinforced quartz material containing titanium (Ti). While a general quartz material has a coefficient of thermal expansion of about $0.55 \times 10^{-6} \, °C^{-1}$, the reinforced quartz material containing titanium (Ti) may have a coefficient of thermal expansion of about $0.01 \times 10^{-6} \, °C^{-1}$.

Figure 7:
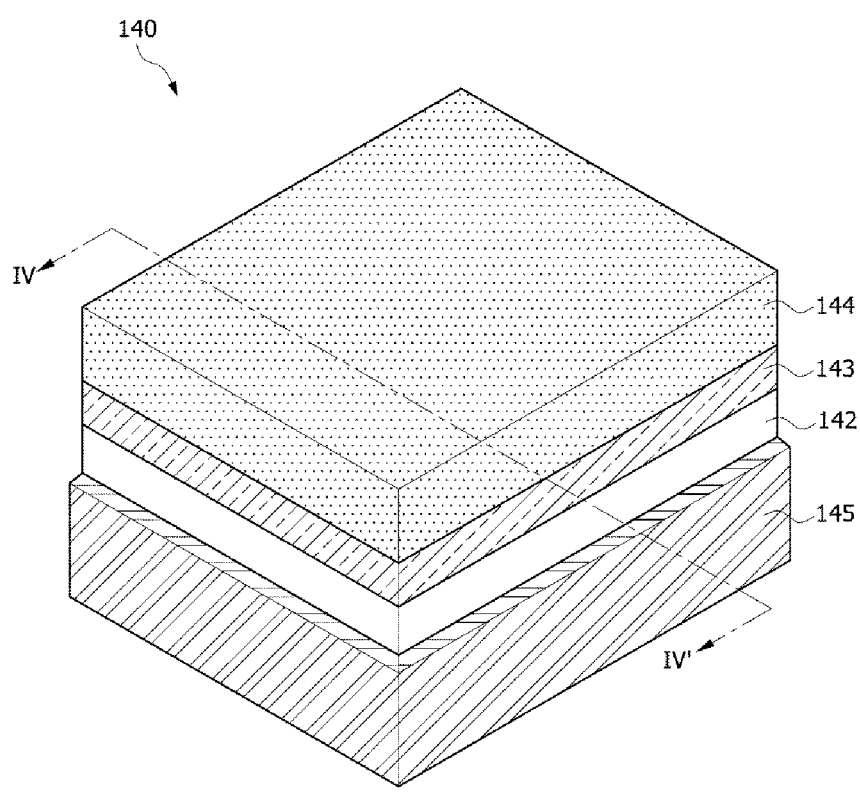
FIG. 7 is a perspective view illustrating a photomask blank according to still another embodiment.
Figure 8:
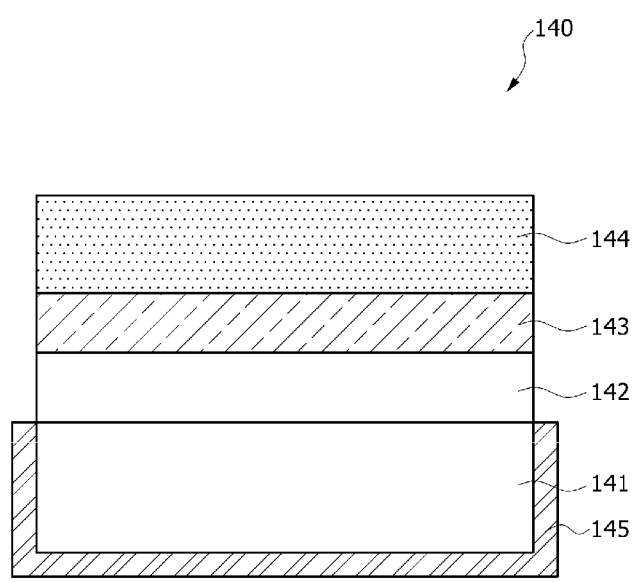
FIG. 8 is a cross-sectional view taken along a line IV-IV' of FIG. 7.

FIG. 7 is a perspective view illustrating a photomask blank 140 according to still another embodiment, and FIG. 8 is a cross-sectional view taken along a line IV-IV' of FIG. 7. Referring to FIGS. 7 and 8, the photomask blank 140 may be provided to fabricate a phase shift mask (PSM). The photomask blank 140 may include a light transmission substrate 141, a phase shift layer 142 disposed on the light transmission substrate 141, a light blocking layer 143 disposed on the phase shift layer 142, and a resist layer 144 disposed on the light blocking layer 143. In some embodiments, the resist layer 144 may be absent. The phase shift layer 142 may cover an entire top surface of the light transmission substrate 141. The light blocking layer 143 may cover an entire top surface of the phase shift layer 142. The resist layer 144 may cover an entire top surface of the light blocking layer 143. In some embodiments, the light transmission substrate 141 may be a quartz substrate, and the phase shift layer 142 may be a molybdenum silicon (MoSi) layer. The light blocking layer 143 may be a chromium (Cr) layer.

A high strength support layer 145 may be disposed on sidewalls and a bottom surface of the light transmission substrate 141. In some embodiments, the high strength support layer 145 may cover the bottom surface and each sidewall of the light transmission substrate 141. The high strength support layer 145 may include a material having a coefficient of thermal expansion that is lower than a coefficient of thermal expansion of the light transmission substrate 141. In some embodiments, when the light transmission substrate 141 is a quartz substrate, the high strength support layer 145 may include a reinforced quartz material containing titanium (Ti). While a general quartz material has a coefficient of thermal expansion of about $0.55 \times 10^{-6} \, °C^{-1}$, the reinforced quartz material containing titanium (Ti) may have a coefficient of thermal expansion of about $0.01 \times 10^{-6} \, °C^{-1}$.

Figure 9:
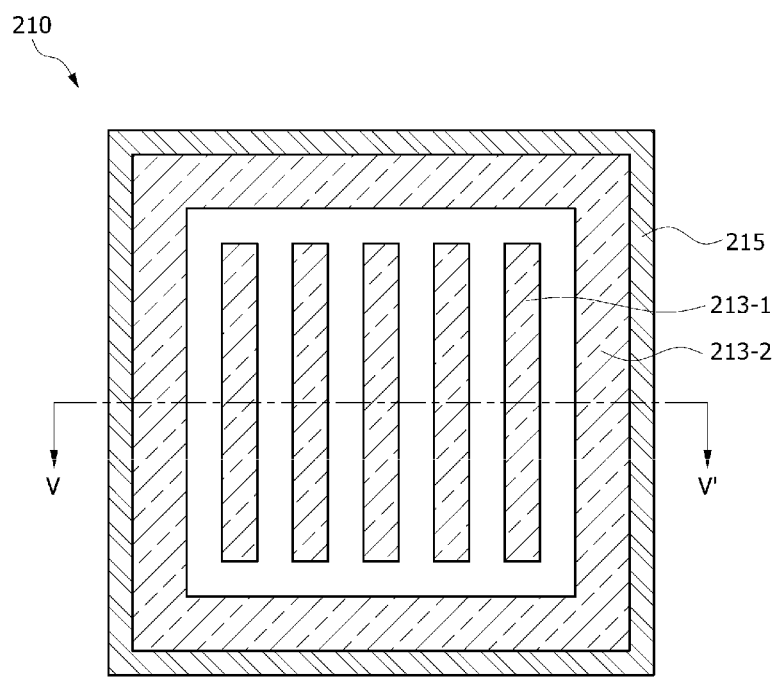
FIG. 9 is a plan view illustrating a photomask according to an embodiment.
Figure 10:
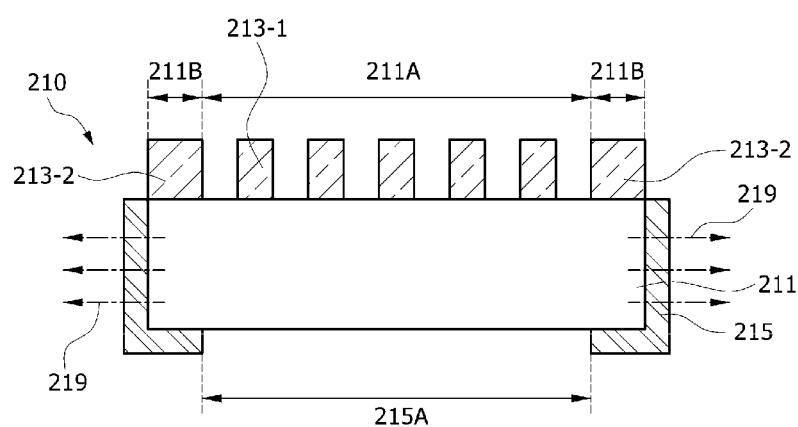
FIG. 10 is a cross-sectional view taken along a line V-V' of FIG. 9.

FIG. 9 is a plan view illustrating a photomask 210 according to an embodiment, and FIG. 10 is a cross-sectional view taken along a line V-V' of FIG. 9. Referring to FIGS. 9 and 10, the photomask 210 may correspond to a binary photomask and may include a plurality of first light blocking patterns 213-1 and a second light blocking pattern 213-2 which are disposed on a top surface of a light transmission substrate 211. The light transmission substrate 211 may be a quartz substrate. The light transmission substrate 211 may have a transfer region 211A and a frame region 211B. The transfer region 211A may be an inner region of the light transmission substrate 211, and the frame region 211B may be edge portions of the light transmission substrate 211 that surround the transfer region 211A. Here, the term "surround" in the context of the relationship between the transfer region 211A and the frame region 211B means that the frame region 211B wraps around sides of the central transfer region 211A so that the central transfer region 211A is enclosed by the frame region 211B in two dimensions. In other words, the frame region 211B surrounds the transfer region in a manner similar to the way a picture frame surrounds a picture.

The transfer region 211A may be divided into a light blocking region covered with the first light blocking patterns 213-1 and a light transmitting region that is not covered with the first light blocking patterns 213-1. Although FIGS. 9 and 10 illustrate an example in which each of the first light blocking patterns 213-1 is a line pattern, the present disclosure is not limited thereto. For example, the first light blocking patterns 213-1 may have various planar shapes, which are transferred onto a wafer. The second light blocking pattern 213-2 may be disposed on the light transmission substrate 211 in the frame region 211B. Although not shown in FIGS. 9 and 10, the second light blocking pattern 213-2 may include overlay patterns having various shapes. In some embodiments, the first light blocking patterns 213-1 and the second light blocking pattern 213-2 may be formed of a chromium (Cr) layer.

A heat radiation pattern 215 may be disposed on sidewalls and a portion of a bottom surface of the light transmission substrate 211. The heat radiation pattern 215 may include a material having a heat conductivity that is higher than a heat conductivity of the light transmission substrate 211. In some embodiments, when the light transmission substrate 211 is a quartz substrate, the heat radiation pattern 215 may include a metal material such as an aluminum (Al) material, a copper (Cu) material, a gold (Au) material or a silver (Ag) material. The heat radiation pattern 215 may cover each sidewall of the light transmission substrate 211. In addition, the heat radiation pattern 215 may cover edge portions of the bottom surface of the light transmission substrate 211, which is vertically aligned with the frame region 211B. A central portion of the bottom surface of the light transmission substrate 211, which is vertically aligned with the transfer region 211A, may be exposed by an opening 215A of the heat radiation pattern 215. The photomask 210 may be a light permeable photomask. During an exposure step, light irradiating a bottom surface of the light transmission substrate 211 may penetrate the light transmission substrate 211 to reach a wafer. The bottom surface of the light transmission substrate 211 irradiated by the light may be exposed by the opening 215A of the heat radiation pattern 215. Accordingly, the heat radiation pattern 215 may not interfere with the exposure step.

The first light blocking patterns 213-1 disposed above the transfer region 211A may be transferred to a wafer during the exposure step. The exposure step may be repeatedly performed to expose a plurality of chip regions included in a single wafer. Thus, exposure energy may be accumulated in the light transmission substrate 211 during the exposure steps, and the accumulated exposure energy may act as a heat source that increases a temperature of the light transmission substrate 211. When the temperature of the light transmission substrate 211 increases, the light transmission substrate 211 may expand to deform the overlay patterns. According to the present embodiment, the photomask 210 may include the heat radiation pattern 215 having a heat conductivity that is higher than a heat conductivity of the light transmission substrate 211. Thus, the heat of the light transmission substrate 211 may be readily emitted into an external space through the heat radiation pattern 215, as indicated by arrows 219. Accordingly, deformation of the overlay patterns may be suppressed.

Figure 11:
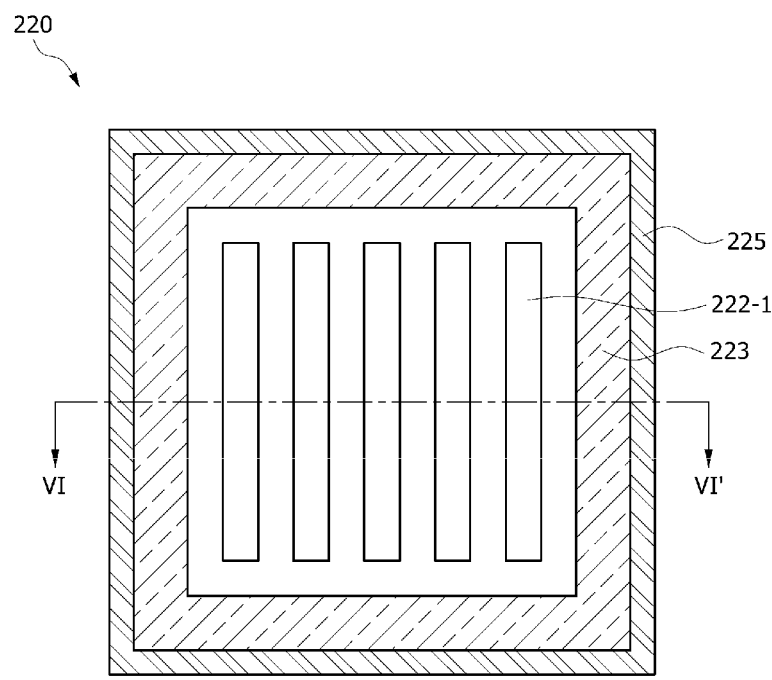
FIG. 11 is a plan view illustrating a photomask according to another embodiment.
Figure 12:
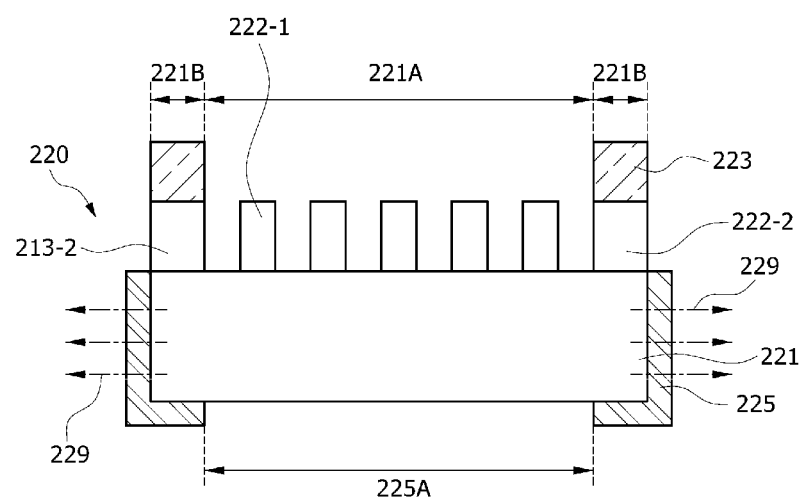
FIG. 12 is a cross-sectional view taken along a line VI-VI' of FIG. 11.

FIG. 11 is a plan view illustrating a photomask 220 according to another embodiment, and FIG. 12 is a cross-sectional view taken along a line VI-VI' of FIG. 11. Referring to FIGS. 11 and 12, the photomask 220 may correspond to a phase shift mask (PSM) and may include a plurality of first phase shift patterns 222-1 and a second phase shift pattern 222-2 which are disposed on a top surface of a light transmission substrate 221. The photomask 220 may further include a light blocking pattern 223 disposed on the second phase shift pattern 222-2. The light transmission substrate 221 may be a quartz substrate. The light transmission substrate 221 may have a transfer region 221A and a frame region 221B. The transfer region 221A may be an inner region of the light transmission substrate 221, and the frame region 221B may be edge portions of the light transmission substrate 221 that surround the transfer region 221A. The transfer region 221A may be divided into a phase shift region covered with the first phase shift patterns 222-1 and a light transmitting region that is not covered with the first phase shift patterns 222-1.

Although FIGS. 11 and 12 illustrate an example in which each of the first phase shift patterns 222-1 is a line pattern, the present disclosure is not limited thereto. For example, the first phase shift patterns 222-1 may have various planar shapes, which are transferred onto a wafer. The second phase shift pattern 222-2 and the light blocking pattern 223 may be sequentially stacked on the light transmission substrate 221 in the frame region 221B. Although not shown in FIGS. 11 and 12, the light blocking pattern 223 may include overlay patterns having various shapes. In some embodiments, the first phase shift patterns 222-1 and the second phase shift pattern 222-2 may be formed of a molybdenum silicon (MoSi) layer. In some embodiments, the light blocking pattern 223 may be formed of a chromium (Cr) layer.

A heat radiation pattern 225 may be disposed on sidewalls and a portion of a bottom surface of the light transmission substrate 221. The heat radiation pattern 225 may include a material having a heat conductivity that is higher than a heat conductivity of the light transmission substrate 221. In some embodiments, when the light transmission substrate 221 is a quartz substrate, the heat radiation pattern 225 may include a metal material such as an aluminum (Al) material, a copper (Cu) material, a gold (Au) material or a silver (Ag) material. The heat radiation pattern 225 may cover each sidewall of the light transmission substrate 221. In addition, the heat radiation pattern 225 may cover edge portions of the bottom surface of the light transmission substrate 221, which are vertically aligned with the frame region 221B.

A central portion of the bottom surface of the light transmission substrate 221, which is vertically aligned with the transfer region 221A, may be exposed by an opening 225A of the heat radiation pattern 225. The photomask 220 may be a light permeable PSM. During an exposure step, light irradiating a bottom surface of the light transmission substrate 221 may penetrate the light transmission substrate 221 to reach a wafer. The bottom surface of the light transmission substrate 221 irradiated by the light may be exposed by the opening 225A of the heat radiation pattern 225. Accordingly, the heat radiation pattern 225 may not interfere with the exposure step.

The first phase shift patterns 222-1 disposed above the transfer region 221A may be transferred to a wafer during the exposure step. The exposure step may be repeatedly performed to expose a plurality of chip regions included in a single wafer. Thus, exposure energy may be accumulated in the light transmission substrate 221 during the exposure steps, and the accumulated exposure energy may act as a heat source that increases a temperature of the light transmission substrate 221. When the temperature of the light transmission substrate 221 increases, the light transmission substrate 221 may expand to deform the overlay patterns. According to the present embodiment, the photomask 220 may include the heat radiation pattern 225 having a heat conductivity that is higher than a heat conductivity of the light transmission substrate 221. Thus, the heat of the light transmission substrate 221 may be readily emitted into an external space through the heat radiation pattern 225, as indicated by arrows 229. Accordingly, deformation of the overlay patterns may be suppressed.

Figure 13:
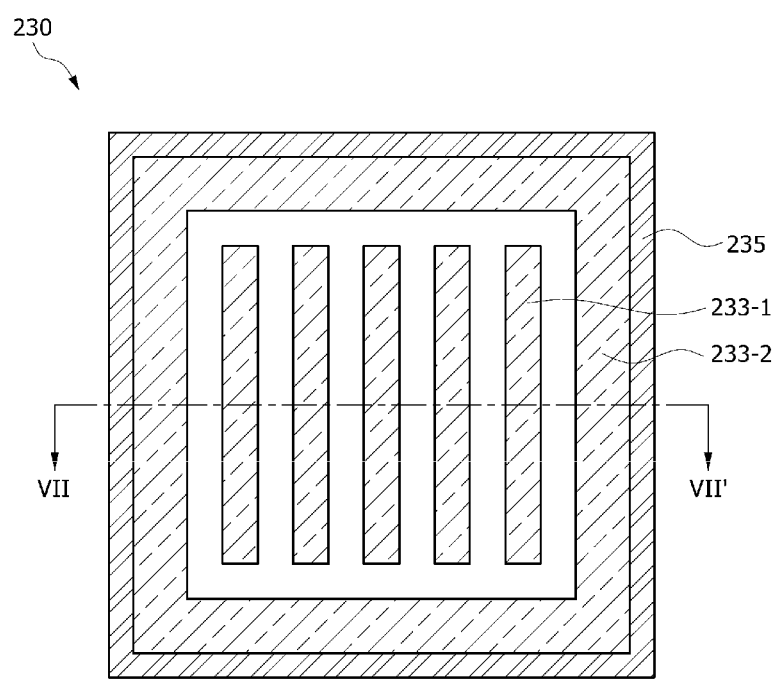
FIG. 13 is a plan view illustrating a photomask according to yet another embodiment.
Figure 14:
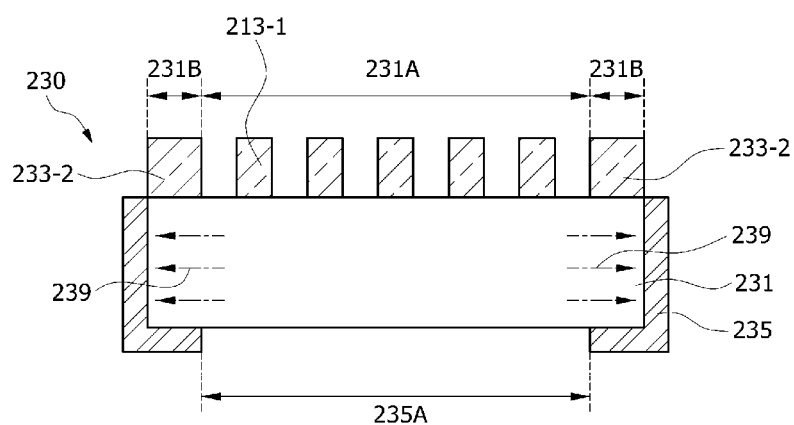
FIG. 14 is a cross-sectional view taken along a line VII-VII' of FIG. 13.

FIG. 13 is a plan view illustrating a photomask 230 according to yet another embodiment, and FIG. 14 is a cross-sectional view taken along a line VII-VII' of FIG. 13. Referring to FIGS. 13 and 14, the photomask 230 may correspond to a binary photomask and may include a plurality of first light blocking patterns 233-1 and a second light blocking pattern 233-2 which are disposed on a top surface of a light transmission substrate 231. The light transmission substrate 231 may be a quartz substrate. The light transmission substrate 231 may have a transfer region 231A and a frame region 231B. The transfer region 231A may be an inner region of the light transmission substrate 231, and the frame region 231B may be edge portions of the light transmission substrate 231 that surround the transfer region 231A. The transfer region 231A may be divided into a light blocking region covered with the first light blocking patterns 233-1 and a light transmitting region that is not covered with the first light blocking patterns 233-1.

Although FIGS. 13 and 14 illustrate an example in which each of the first light blocking patterns 233-1 is a line pattern, the present disclosure is not limited thereto. For example, the first light blocking patterns 233-1 may have various planar shapes, which are transferred onto a wafer. The second light blocking pattern 233-2 may be disposed on the light transmission substrate 231 in the frame region 231B. Although not shown in FIGS. 13 and 14, the second light blocking pattern 233-2 may include overlay patterns having various shapes. In some embodiments, the first light blocking patterns 233-1 and the second light blocking pattern 233-2 may be formed of a chromium (Cr) layer.

A high strength support pattern 235 may be disposed on sidewalls of the light transmission substrate 231. Although not shown in FIGS. 13 and 14, an adhesive layer may be disposed between the light transmission substrate 231 and the high strength support pattern 235. The high strength support pattern 235 may cover a portion of a bottom surface of the light transmission substrate 231. In such a case, an adhesive strength between the light transmission substrate 231 and the high strength support pattern 235 may increase. The high strength support pattern 235 may include a material having a coefficient of thermal expansion that is lower than a coefficient of thermal expansion of the light transmission substrate 231. In some embodiments, when the light transmission substrate 231 is a quartz substrate, the high strength support pattern 235 may include a reinforced quartz material containing titanium (Ti). While a general quartz material has a coefficient of thermal expansion of about $0.55 \times 10^{-6} °C^{-1}$, the reinforced quartz material containing titanium (Ti) may have a coefficient of thermal expansion of about $0.01 \times 10^{-6} °C^{-1}$.

When the high strength support pattern 235 extends onto the bottom surface of the light transmission substrate 231, the high strength support pattern 235 may cover edge portions of the bottom surface of the light transmission substrate 231, which are vertically aligned with the frame region 231B. A central portion of the bottom surface of the light transmission substrate 231, which is vertically aligned with the transfer region 231A, may be exposed by an opening 235A of the high strength support pattern 235. The photomask 230 may be a light permeable binary photomask. During an exposure step, light irradiating a bottom surface of the light transmission substrate 231 may penetrate the light transmission substrate 231 to reach a wafer. The bottom surface of the light transmission substrate 231 irradiated by the light may be exposed by the opening 235A of the high strength support pattern 235. Accordingly, the high strength support pattern 235 may not interfere with the exposure step.

The first light blocking patterns 233-1 disposed above the transfer region 231A may be transferred to a wafer during the exposure step. The exposure step may be repeatedly performed to expose a plurality of chip regions included in a single wafer. Thus, exposure energy may be accumulated in the light transmission substrate 231 during the exposure steps, and the accumulated exposure energy may act as a heat source that increases a temperature of the light transmission substrate 231. When the temperature of the light transmission substrate 231 increases, the light transmission substrate 231 may expand to deform the overlay patterns. According to the present embodiment, the photomask 230 may include the high strength support pattern 235 having a coefficient of thermal expansion that is lower than a coefficient of thermal expansion of the light transmission substrate 231. Thus, the high strength support pattern 235 may suppress the lateral expansion, depicted by arrows 239 in FIG. 14, of the light transmission substrate 231. Accordingly, deformation of the overlay patterns may be suppressed.

Figure 15:
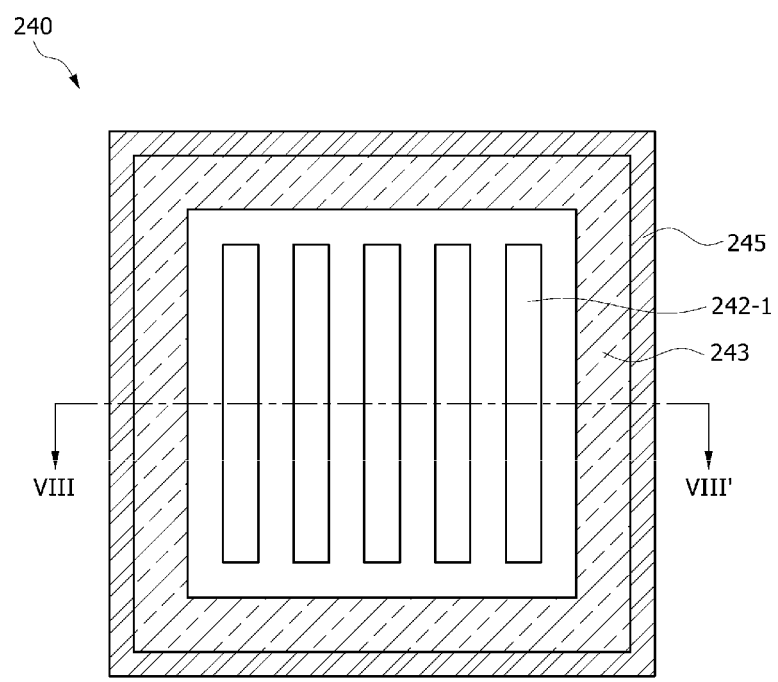
FIG. 15 is a plan view illustrating a photomask according to still another embodiment.
Figure 16:
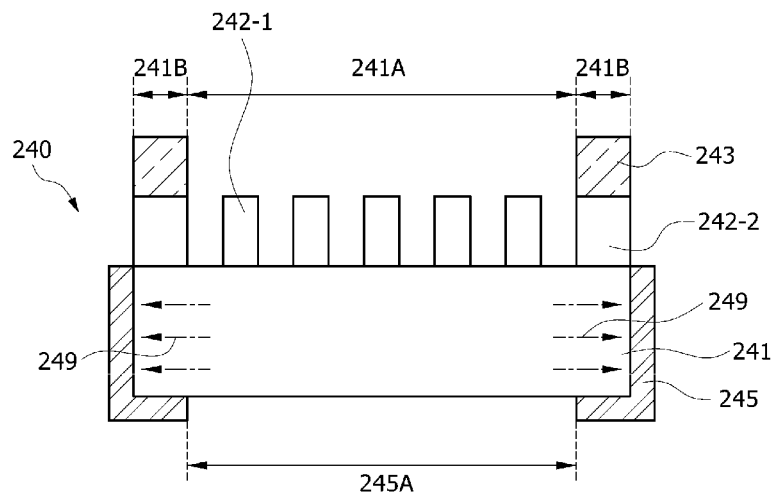
FIG. 16 is a cross-sectional view taken along a line VIII-VIII' of FIG. 15.

FIG. 15 is a plan view illustrating a photomask 240 according to still another embodiment, and FIG. 16 is a cross-sectional view taken along a line VII-VII' of FIG. 15. Referring to FIGS. 15 and 16, the photomask 240 may correspond to a PSM and may include a plurality of first phase shift patterns 242-1 and a second phase shift pattern 242-2 which are disposed on a top surface of a light transmission substrate 241. The photomask 240 may further include a light blocking pattern 243 disposed on the second phase shift pattern 242-2. The light transmission substrate 241 may be a quartz substrate. The light transmission substrate 241 may have a transfer region 241A and a frame region 241B. The transfer region 241A may be an inner region of the light transmission substrate 241, and the frame region 241B may be edge portions of the light transmission substrate 241 that surround the transfer region 241A. The transfer region 241A may be divided into a phase shift region covered with the first phase shift patterns 242-1 and a light transmitting region that is not covered with the first phase shift patterns 242-1.

Although FIGS. 15 and 16 illustrate an example in which each of the first phase shift patterns 242-1 is a line pattern, the present disclosure is not limited thereto. For example, the first phase shift patterns 242-1 may have various planar shapes, which are transferred onto a wafer. The second phase shift pattern 242-2 and the light blocking pattern 243 may be sequentially stacked on the light transmission substrate 241 in the frame region 241B. Although not shown in FIGS. 15 and 16, the light blocking pattern 243 may include overlay patterns having various shapes. In some embodiments, the first phase shift patterns 242-1 and the second phase shift pattern 242-2 may be formed of a molybdenum silicon (MoSi) layer. In some embodiments, the light blocking pattern 243 may be formed of a chromium (Cr) layer.

A high strength support pattern 245 may be disposed on sidewalls of the light transmission substrate 241. Although not shown in FIGS. 15 and 16, an adhesive layer may be disposed between the light transmission substrate 241 and the high strength support pattern 245. The high strength support pattern 245 may cover a portion of a bottom surface of the light transmission substrate 241. In such a case, an adhesive strength between the light transmission substrate 241 and the high strength support pattern 245 may increase. The high strength support pattern 245 may include a material having a coefficient of thermal expansion that is lower than a coefficient of thermal expansion of the light transmission substrate 241. In some embodiments, when the light transmission substrate 241 is a quartz substrate, the high strength support pattern 245 may include a reinforced quartz material containing titanium (Ti). While a general quartz material has a coefficient of thermal expansion of about $0.55 \times 10^{-6} \,^{\circ}C^{-1}$, the reinforced quartz material containing titanium (Ti) may have a coefficient of thermal expansion of about $0.01 \times 10^{-6} \,^{\circ}C^{-1}$.

When the high strength support pattern 245 extends onto the bottom surface of the light transmission substrate 241, the high strength support pattern 245 may cover edge portions of the bottom surface of the light transmission substrate 241, which are vertically aligned with the frame region 241B. A central portion of the bottom surface of the light transmission substrate 241, which is vertically aligned with the transfer region 241A, may be exposed by an opening 245A of the high strength support pattern 245. The photomask 240 may be a light permeable PSM. During an exposure step, light irradiating a bottom surface of the light transmission substrate 241 may penetrate the light transmission substrate 241 to reach a wafer. The bottom surface of the light transmission substrate 241 irradiated by the light may be exposed by the opening 245A of the high strength support pattern 245. Accordingly, the high strength support pattern 245 may not interfere with the exposure step.

The first phase shift patterns 242-1 disposed above the transfer region 241A may be transferred to a wafer during the exposure step. The exposure step may be repeatedly performed to expose a plurality of chip regions included in a single wafer. Thus, exposure energy may be accumulated in the light transmission substrate 241 during the exposure steps, and the accumulated exposure energy may act as a heat source that increases a temperature of the light transmission substrate 241. When the temperature of the light transmission substrate 241 increases, the light transmission substrate 241 may expand to deform the overlay patterns. According to the present embodiment, the photomask 240 may include the high strength support pattern 245 having a coefficient of thermal expansion that is lower than a coefficient of thermal expansion of the light transmission substrate 241. Thus, the high strength support pattern 245 may suppress the lateral expansion, depicted by arrows 249 in FIG. 16, of the light transmission substrate 241. Accordingly, deformation of the overlay patterns may be suppressed.

Figure 17:
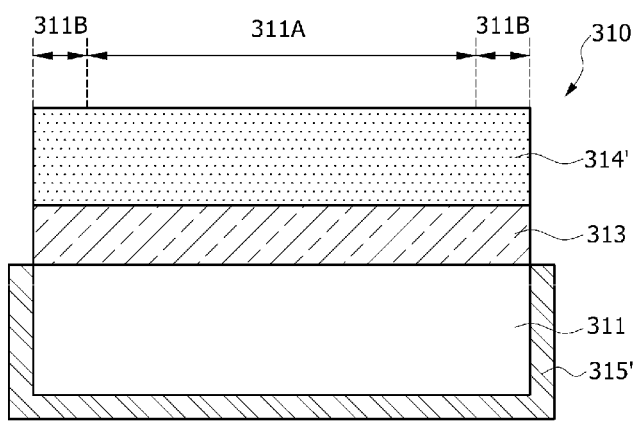
FIGS. 17 to 20 are cross-sectional views illustrating a method of fabricating a photomask according to an embodiment.

FIGS. 17 to 20 are cross-sectional views illustrating a method of fabricating a photomask according to an embodiment. As illustrated in FIG. 17, a photomask blank 310 including a light blocking layer 313 and a resist layer 314' stacked on a top surface of a light transmission substrate 311 may be provided. The photomask blank 310 may further include a heat radiation layer 315' disposed on sidewalls and a bottom surface of the light transmission substrate 311. The light transmission substrate 311 may have a transfer region 311A and a frame region 311B surrounding the transfer region 311A. The photomask blank 310 may have the same structure and configuration as the photomask blank 110 described with reference to FIGS. 1 and 2.

Figure 18:
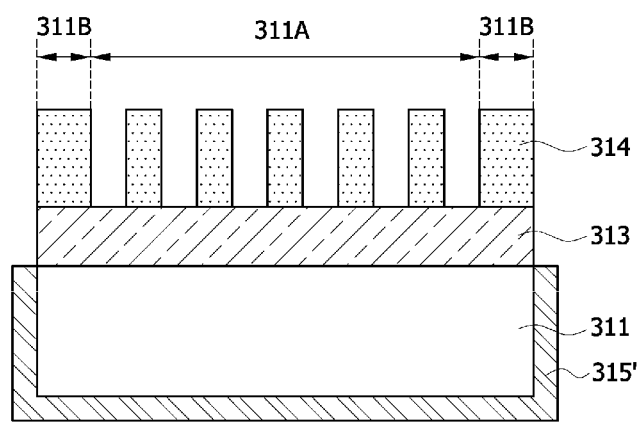

As illustrated in FIGS. 17 and 18, portions of the resist layer 314' may be selectively exposed and developed to form a resist pattern 314. In some embodiments, the resist layer 314' may be exposed using an electron beam exposure technique. The resist pattern 314 may cover the frame region 311B of a top surface of the light blocking layer 313 and cover portions of a top surface of the light blocking layer 313 above the transfer region 311A.

Figure 19:
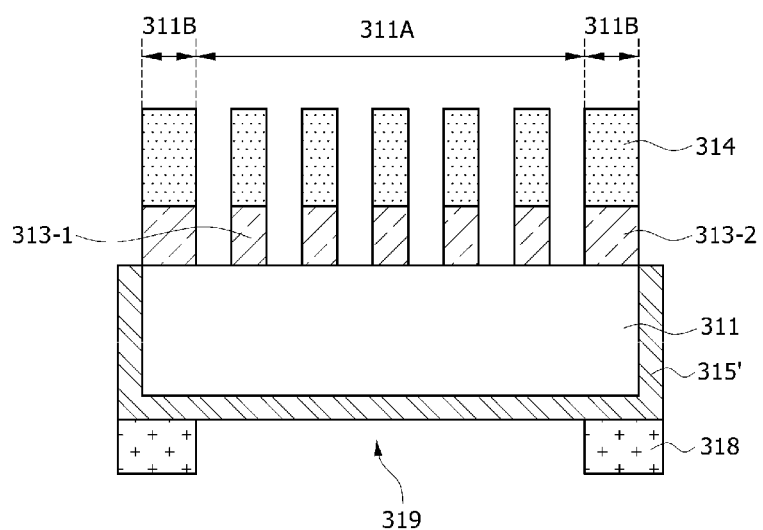

As illustrated in FIG. 19, the light blocking layer 313 may be etched using the resist pattern 314 as an etch mask, thereby forming first light blocking patterns 313-1 and a second light blocking pattern 313-2. The first light blocking patterns 313-1 may expose a portion of the light transmission substrate 311 in the transfer region 311A. The second light blocking pattern 313-2 may cover the frame region 311B of the light transmission substrate 311. Subsequently, a mask pattern 318 may be formed on a bottom surface of the heat radiation layer 315' opposite to the light transmission substrate 311. The mask pattern 318 may have an opening 319 that exposes the heat radiation layer 315' below the transfer region 311A.

Figure 20:
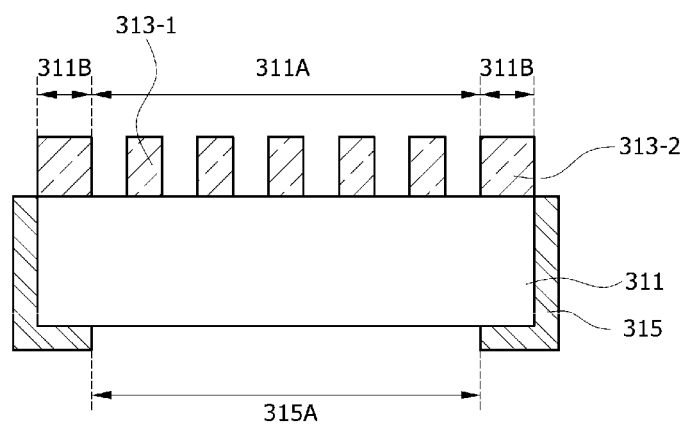

As illustrated in FIGS. 19 and 20, the heat radiation layer 315' on the bottom surface of the light transmission substrate 311 may be etched using the mask pattern 318 as an etch mask, thereby forming a heat radiation pattern 315. As a result, the heat radiation pattern 315 may cover edge portions of the bottom surface and each sidewall of the light transmission substrate 311. The heat radiation pattern 315 may have an opening 315A that exposes the bottom surface of the light transmission substrate 311 in the transfer region 311A. After forming the heat radiation pattern 315, the resist pattern 314 and the mask pattern 318 may be removed.

Figure 21:
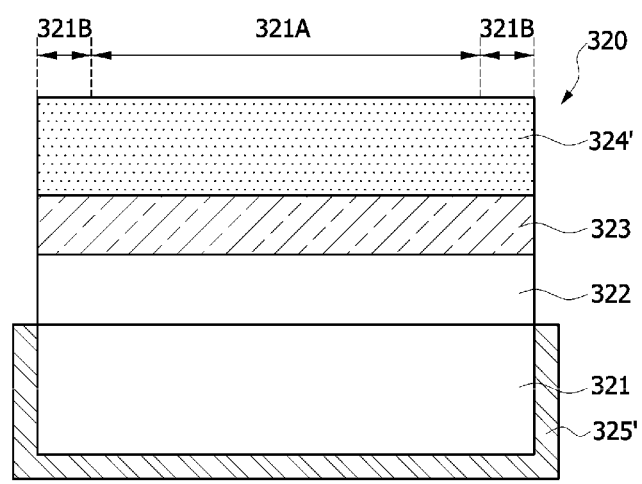
FIGS. 21 to 26 are cross-sectional views illustrating a method of fabricating a photomask according to another embodiment.

FIGS. 21 to 26 are cross-sectional views illustrating a method of fabricating a photomask according to another embodiment. As illustrated in FIG. 21, a photomask blank 320 including a phase shift layer 322, a light blocking layer 323 and a resist layer 324' stacked on a top surface of a light transmission substrate 321 may be provided. The photomask blank 320 may further include a heat radiation layer 325' disposed on sidewalls and a bottom surface of the light transmission substrate 321. The light transmission substrate 321 may have a transfer region 321A and a frame region 321B surrounding the transfer region 321A. The photomask blank 320 may have the same structure and configuration as the photomask blank 120 described with reference to FIGS. 3 and 4.

Figure 22:
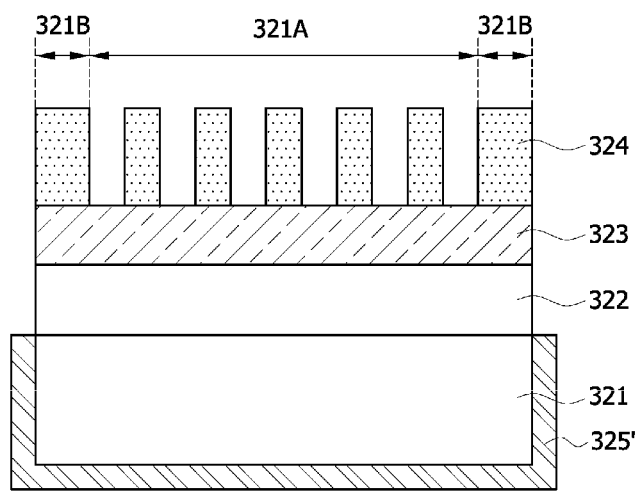

As illustrated in FIGS. 21 and 22, portions of the resist layer 324' may be selectively exposed and developed to form a first resist pattern 324. In some embodiments, the resist layer 324' may be exposed using an electron beam exposure technique. The first resist pattern 324 may cover an entire top surface of the light blocking layer 323 above the frame region 321B and cover portions of a top surface of the light blocking layer 323 above the transfer region 321A.

Figure 23:
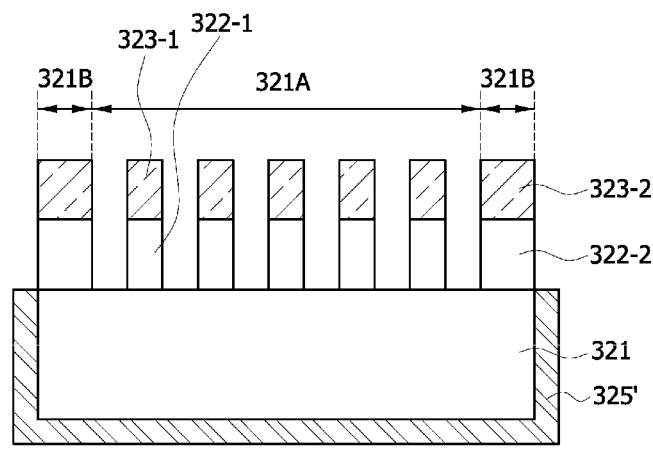

As illustrated in FIGS. 22 and 23, the light blocking layer 323 and the phase shift layer 322 may be etched using the first resist pattern 324 as an etch mask, thereby forming first phase shift patterns 322-1, a second phase shift pattern 322-2, first light blocking patterns 323-1 and a second light blocking pattern 323-2. The first phase shift patterns 322-1 and the first light blocking patterns 323-1 may expose a portion of the light transmission substrate 321 in the transfer region 321A. The second phase shift pattern 322-2 and the second light blocking pattern 323-2 may cover the frame region 321B of the light transmission substrate 321. After forming the first phase shift patterns 322-1, the second phase shift pattern 322-2, the first light blocking patterns 323-1 and the second light blocking pattern 323-2, the first resist pattern 324 may be removed.

Figure 24:
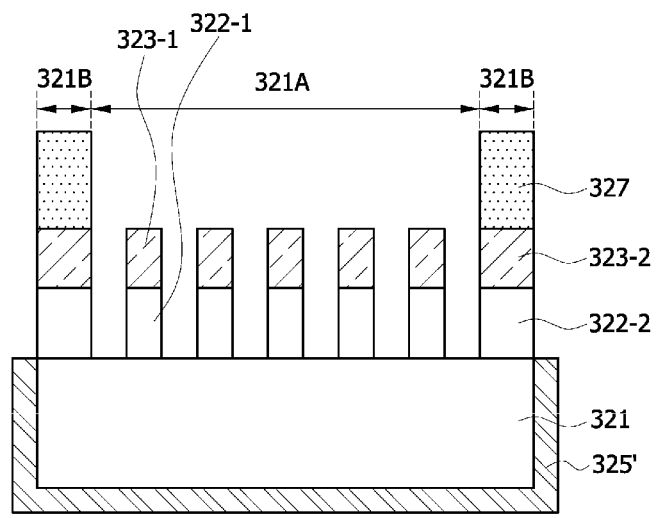

As illustrated in FIG. 24, a second resist pattern 327 may be formed on the second light blocking pattern 323-2, such that a portion of the transfer region 321A is exposed. More specifically, the second resist pattern 327 may be formed by coating an entire surface of the substrate including the first and second light blocking patterns 323-1 and 323-2 with a second resist layer after the first resist pattern 324 is removed and by selectively removing a portion of the second resist layer with an electron beam exposure technique and a development technique to expose the first light blocking patterns 323-1 above the transfer region 321A.

Figure 25:
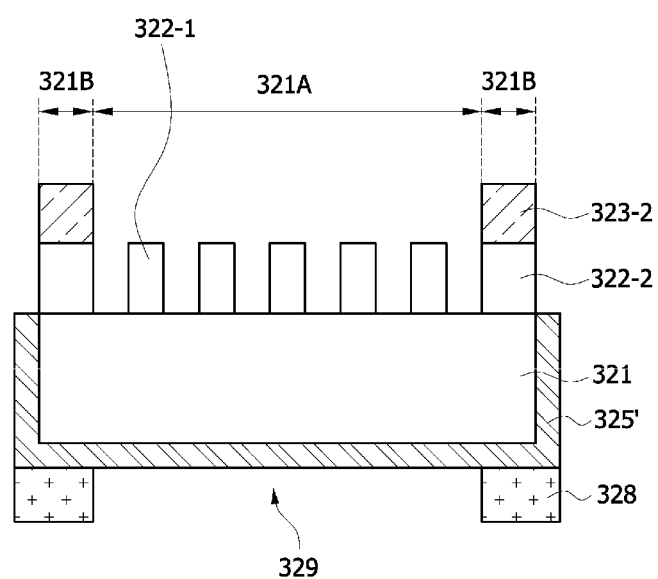

As illustrated in FIGS. 24 and 25, all of the first light blocking patterns 323-1 above the transfer region 321A may be removed using the second resist pattern 327 as an etch mask to expose the first phase shift patterns 322-1. Accordingly, the transfer region 321A may be divided into a phase shift region covered with the first phase shift patterns 322-1 and a light transmitting region that is not covered with the first phase shift patterns 322-1, and the frame region 321B may be covered with the second phase shift pattern 322-2 and the second light blocking pattern 323-2. Subsequently, the second resist pattern 327 may be removed, and a mask pattern 328 may be formed on a bottom surface of the heat radiation layer 325' opposite to the light transmission substrate 321. The mask pattern 328 may have an opening 329 that exposes the heat radiation layer 325' below the transfer region 321A.

Figure 26:
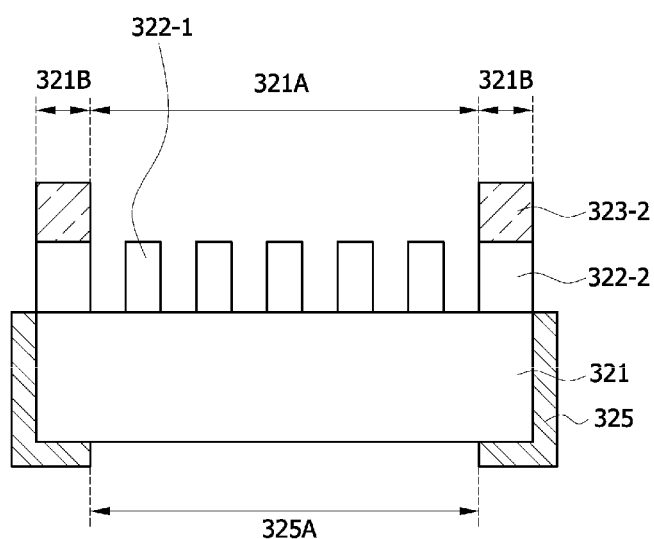

As illustrated in FIG. 26, the heat radiation layer 325' on the bottom surface of the light transmission substrate 321 may be etched using the mask pattern 328 as an etch mask, thereby forming a heat radiation pattern 325. As a result, the heat radiation pattern 325 may cover edge portions of the bottom surface and each sidewall of the light transmission substrate 321. The heat radiation pattern 325 may have an opening 325A that exposes the bottom surface of the light transmission substrate 321 in the transfer region 321A. After forming the heat radiation pattern 325, the mask pattern 328 may be removed.

Figure 27:
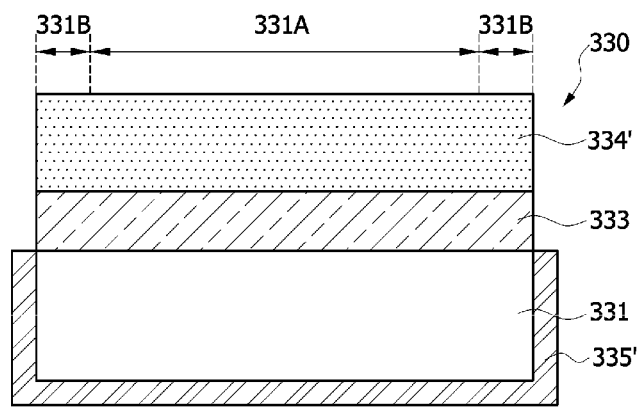
FIGS. 27 to 30 are cross-sectional views illustrating a method of fabricating a photomask according to yet another embodiment.

FIGS. 27 to 30 are cross-sectional views illustrating a method of fabricating a photomask according to yet another embodiment. As illustrated in FIG. 27, a photomask blank 330 including a light blocking layer 333 and a resist layer 334' stacked on a top surface of a light transmission substrate 331 may be provided. The photomask blank 330 may further include a high strength support layer 335' disposed on sidewalls and a bottom surface of the light transmission substrate 331. The light transmission substrate 331 may have a transfer region 331A and a frame region 331B surrounding the transfer region 331A. The photomask blank 330 may have the same structure and configuration as the photomask blank 130 described with reference to FIGS. 5 and 6.

Figure 28:
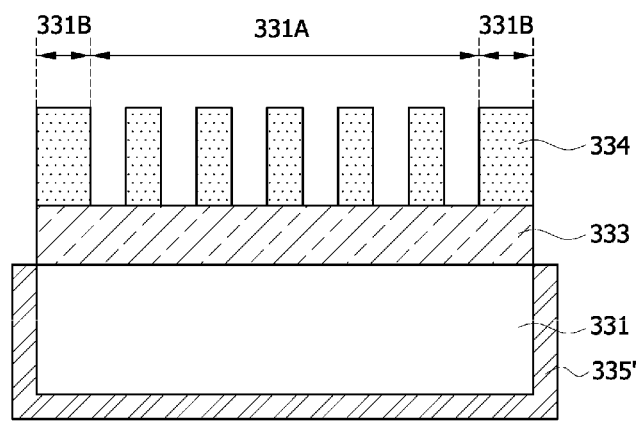

As illustrated in FIGS. 27 and 28, portions of the resist layer 334' may be selectively exposed and developed to form a resist pattern 334. In some embodiments, the resist layer 334' may be exposed using an electron beam exposure technique. The resist pattern 334 may cover the frame region 331B of a top surface of the light blocking layer 333 and cover portions of a top surface of the light blocking layer 333 above the transfer region 331A.

Figure 29:
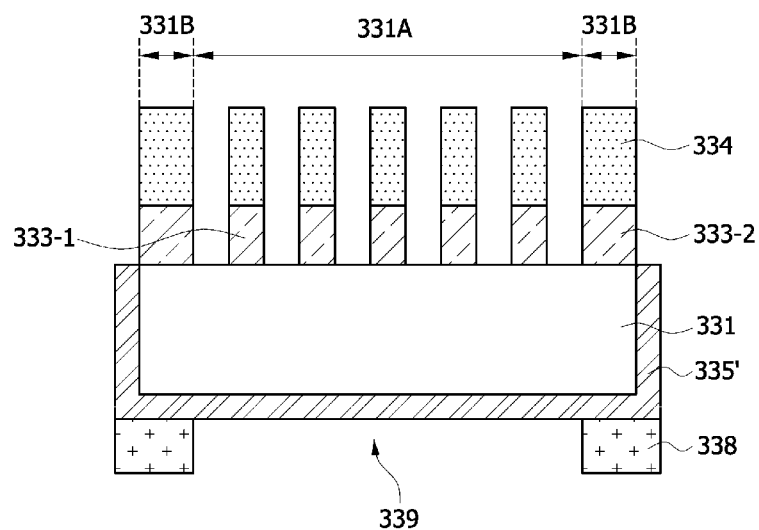

As illustrated in FIG. 29, the light blocking layer 333 may be etched using the resist pattern 334 as an etch mask, thereby forming first light blocking patterns 333-1 and a second light blocking pattern 333-2. The first light blocking patterns 333-1 may expose a portion of the light transmission substrate 331 in the transfer region 331A. The second light blocking pattern 333-2 may cover the frame region 331B of the light transmission substrate 331. Subsequently, a mask pattern 338 may be formed on a bottom surface of the high strength support layer 335' opposite to the light transmission substrate 331. The mask pattern 338 may have an opening 339 that exposes the high strength support layer 335' below the transfer region 331A.

Figure 30:
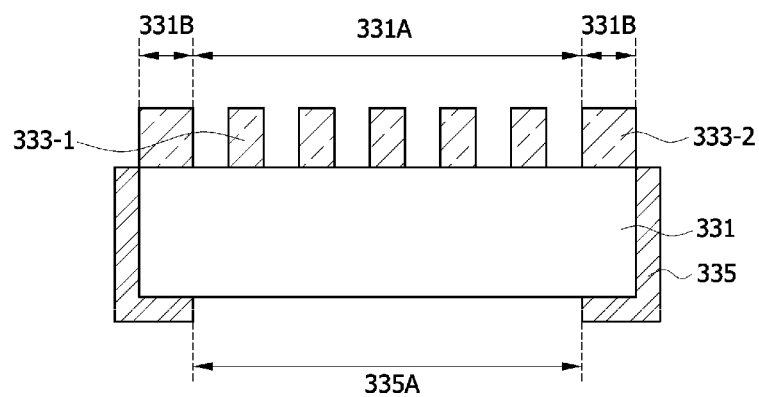

As illustrated in FIG. 30, the high strength support layer 335' on the bottom surface of the light transmission substrate 331 may be etched using the mask pattern 338 as an etch mask, thereby forming a high strength support pattern 335. As a result, the high strength support pattern 335 may cover edge portions of the bottom surface and each sidewall of the light transmission substrate 331. The high strength support pattern 335 may have an opening 335A that exposes the bottom surface of the light transmission substrate 331 in the transfer region 331A. After forming the high strength support pattern 335, the resist pattern 334 and the mask pattern 338 may be removed.

Figure 31:
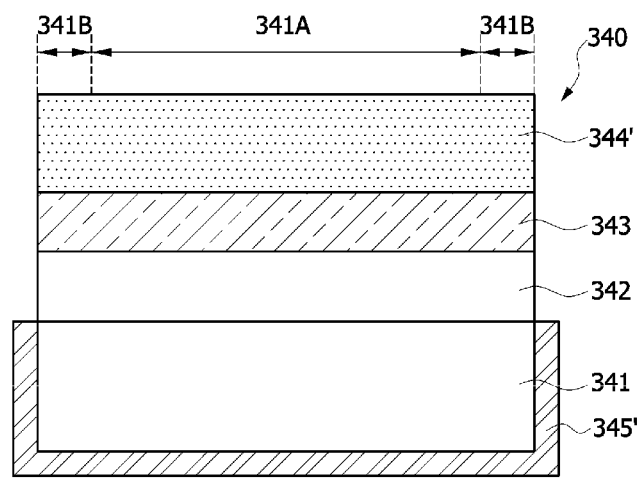
FIGS. 31 to 36 are cross-sectional views illustrating a method of fabricating a photomask according to still another embodiment.

FIGS. 31 to 36 are cross-sectional views illustrating a method of fabricating a photomask according to still another embodiment. As illustrated in FIG. 31, a photomask blank 340 including a phase shift layer 342, a light blocking layer 343 and a resist layer 344' stacked on a top surface of a light transmission substrate 341 may be provided. The photomask blank 340 may further include a high strength support layer 345' disposed on sidewalls and a bottom surface of the light transmission substrate 341. The light transmission substrate 341 may have a transfer region 341A and a frame region 341B surrounding the transfer region 341A. The photomask blank 340 may have the same structure and configuration as the photomask blank 140 described with reference to FIGS. 7 and 8.

Figure 32:
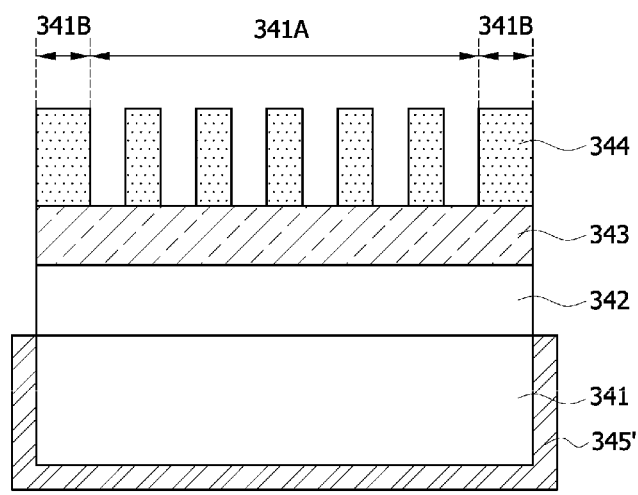

As illustrated in FIGS. 31 and 32, portions of the resist layer 344' of may be selectively exposed and developed to form a first resist pattern 344. In some embodiments, the resist layer 344' may be exposed using an electron beam exposure technique. The first resist pattern 344 may cover the frame region 341B of a top surface of the light blocking layer 343 and cover portions of a top surface of the light blocking layer 343 above the transfer region 341A.

Figure 33:
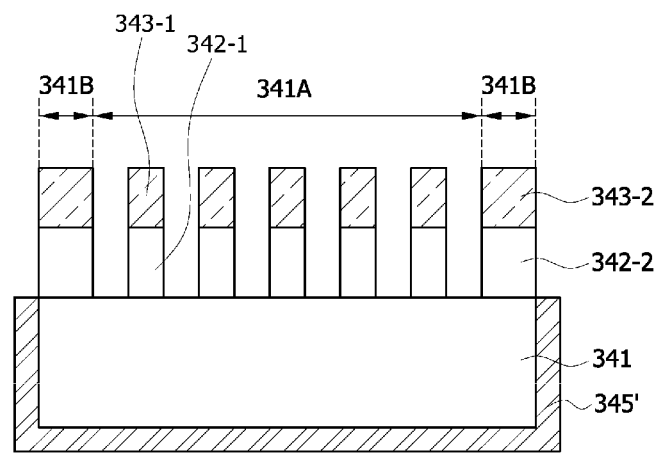

As illustrated in FIGS. 32 and 33, the light blocking layer 343 and the phase shift layer 342 may be etched using the first resist pattern 344 as an etch mask, thereby forming first phase shift patterns 342-1, a second phase shift pattern 342-2, first light blocking patterns 343-1 and a second light blocking pattern 343-2. The first phase shift patterns 342-1 and the first light blocking patterns 343-1 may expose a portion of the light transmission substrate 341 in the transfer region 341A. The second phase shift pattern 342-2 and the second light blocking pattern 343-2 may cover the frame region 341B of the light transmission substrate 341. After forming the first phase shift patterns 342-1, the second phase shift pattern 342-2, the first light blocking patterns 343-1 and the second light blocking pattern 343-2, the first resist pattern 344 may be removed.

Figure 34:
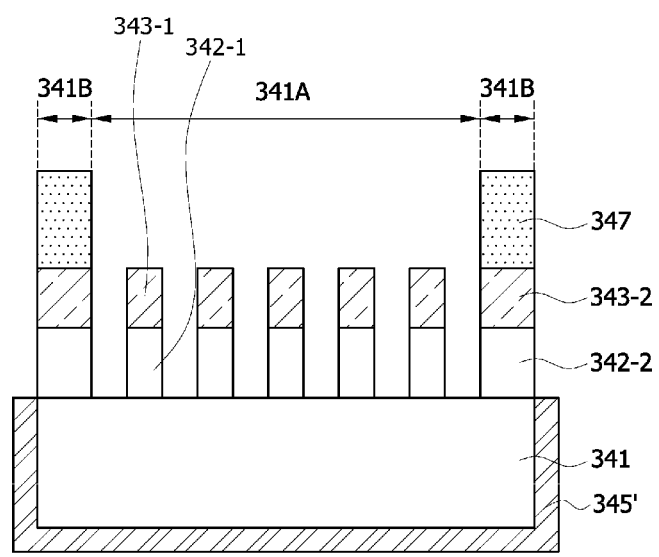

As illustrated in FIG. 34, a second resist pattern 347 may be formed on the second light blocking pattern 343-2, the transfer region 341A is exposed. More specifically, the second resist pattern 347 may be formed by coating an entire surface of the substrate including the first and second light blocking patterns 343-1 and 343-2 with a second resist layer after the first resist pattern 344 is removed and by selectively removing a portion of the second resist layer with an electron beam exposure technique and a development technique to expose the first light blocking patterns 343-1 in the transfer region 341A.

Figure 35:
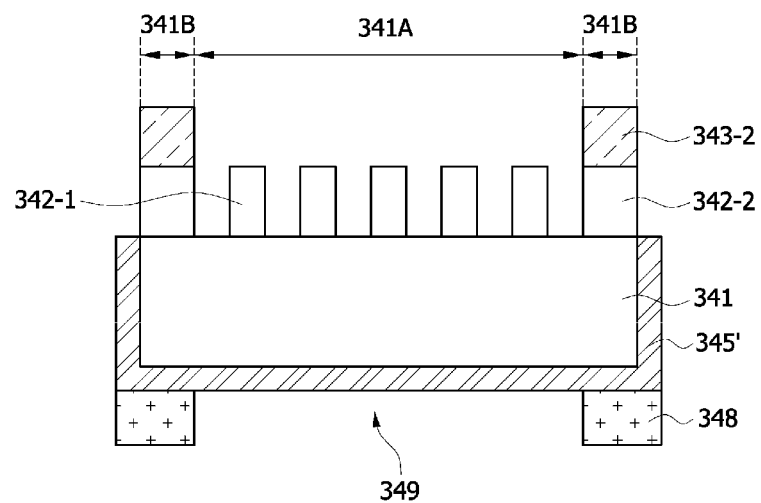

As illustrated in FIGS. 34 and 35, all of the first light blocking patterns 343-1 above the transfer region 341A may be removed using the second resist pattern 347 as an etch mask to expose the first phase shift patterns 342-1. Accordingly, the transfer region 341A may be divided into a phase shift region covered with the first phase shift patterns 342-1 and a light transmitting region that is not covered with the first phase shift patterns 342-1, and the frame region 341B may be covered with the second phase shift pattern 342-2 and the second light blocking pattern 343-2. Subsequently, the second resist pattern 347 may be removed, and a mask pattern 348 may be formed on a bottom surface of the high strength support layer 345' opposite to the light transmission substrate 341. The mask pattern 348 may have an opening 349 that exposes the high strength support layer 345' below the transfer region 341A.

Figure 36:
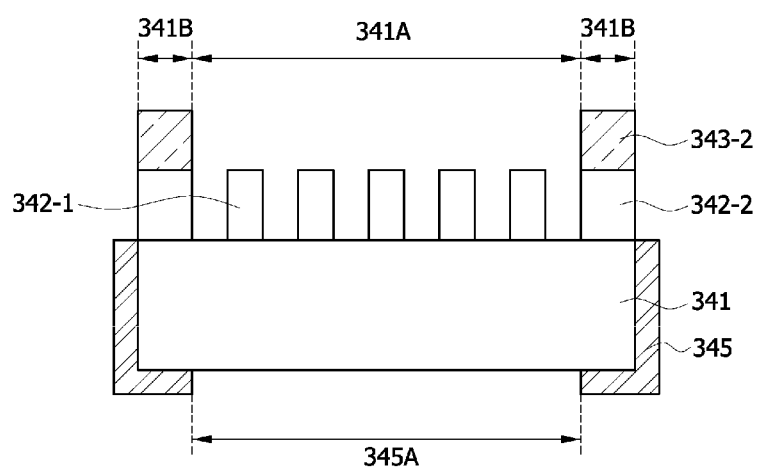

As illustrated in FIG. 36, the high strength support layer 345' on the bottom surface of the light transmission substrate 341 may be etched using the mask pattern 348 as an etch mask, thereby forming a high strength support pattern 345. As a result, the high strength support pattern 345 may cover edge portions of the bottom surface and each sidewall of the light transmission substrate 341. The high strength support pattern 345 may have an opening 345A that exposes the bottom surface of the light transmission substrate 341 in the transfer region 341A. After forming the high strength support pattern 345, the mask pattern 348 may be removed.

The embodiments of the present disclosure have been disclosed above for illustrative purposes. Those of ordinary skill in the art will appreciate that various modifications, additions, and substitutions are possible, without departing from the scope and spirit of the present disclosure as claimed below.

What is claimed is:

1. A photomask blank comprising:
   a light transmission substrate;
   a light blocking layer disposed on a top surface of the light transmission substrate; and
   a heat radiation layer disposed on sidewalls and a bottom surface of the light transmission substrate.

2. The photomask blank of claim 1, wherein the light transmission substrate includes a quartz material.

3. The photomask blank of claim 1, wherein the heat radiation layer includes a material having a heat conductivity that is higher than a heat conductivity of the light transmission substrate.

4. The photomask blank of claim 3, wherein the heat radiation layer includes a metal material.

5. The photomask blank of claim 4, wherein the heat radiation layer includes an aluminum (Al) material, a copper (Cu) material, a gold (Au) material or a silver (Ag) material.

6. The photomask blank of claim 1, wherein the heat radiation layer covers an entire bottom surface and each sidewall of the light transmission substrate.

7. The photomask blank of claim 1, further comprising a resist layer disposed on the light blocking layer.

8. A photomask blank comprising:
   a light transmission substrate;
   a phase shift layer disposed on a top surface of the light transmission substrate;
   a light blocking layer disposed on the phase shift layer; and
   a heat radiation layer disposed on sidewalls and a bottom surface of the light transmission substrate.

9. The photomask blank of claim 8, wherein the light transmission substrate includes a quartz material.

10. The photomask blank of claim 8, wherein the heat radiation layer includes a material having a heat conductivity that is higher than a heat conductivity of the light transmission substrate.

11. The photomask blank of claim 10, wherein the heat radiation layer includes a metal material.

12. The photomask blank of claim 11, wherein the heat radiation layer includes an aluminum (Al) material, a copper (Cu) material, a gold (Au) material or a silver (Ag) material.

13. The photomask blank of claim 8, wherein the heat radiation layer covers an entire bottom surface and each sidewall of the light transmission substrate.

14. The photomask blank of claim 8, further comprising a resist layer disposed on the light blocking layer.

15. A photomask blank comprising:
   a light transmission substrate;
   a light blocking layer disposed on a top surface of the light transmission substrate; and
   a high strength support layer disposed on sidewalls and a bottom surface of the light transmission substrate.

16. The photomask blank of claim 15, wherein the light transmission substrate includes a quartz material.

17. The photomask blank of claim 15, wherein the high strength support layer includes a material having a coefficient of thermal expansion that is lower than a coefficient of thermal expansion of the light transmission substrate.

18. The photomask blank of claim 17, wherein the high strength support layer includes a reinforced quartz material containing titanium (Ti).

19. The photomask blank of claim 15, wherein the high strength support layer covers an entire bottom surface and each sidewall of the light transmission substrate.

20. The photomask blank of claim 15, further comprising a resist layer disposed on the light blocking layer.

* * * * *